# (12) United States Patent
Bakker et al.

(10) Patent No.: US 7,692,169 B2
(45) Date of Patent: Apr. 6, 2010

(54) METHOD FOR FILTERING PARTICLES OUT OF A BEAM OF RADIATION AND FILTER FOR A LITHOGRAPHIC APPARATUS

(75) Inventors: Levinus Pieter Bakker, Helmond (NL); Derk Jan Wilfred Klunder, Geldrop (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 818 days.

(21) Appl. No.: 11/493,848

(22) Filed: Jul. 27, 2006

(65) Prior Publication Data
US 2007/0023693 A1 Feb. 1, 2007

Related U.S. Application Data

(63) Continuation-in-part of application No. 11/317,240, filed on Dec. 27, 2005, now Pat. No. 7,414,251.

(60) Provisional application No. 60/639,318, filed on Dec. 28, 2004.

(51) Int. Cl.
  *H05G 2/00* (2006.01)
(52) U.S. Cl. .............................. 250/504 R; 250/492.1; 250/493.1; 355/30; 378/119; 313/163; 313/232; 313/231.61
(58) Field of Classification Search ............. 250/492.1, 250/493.1, 504 R; 355/30; 378/119; 313/163, 313/232, 231.61
See application file for complete search history.

(56) References Cited

U.S. PATENT DOCUMENTS

| 6,317,479 | B1* | 11/2001 | Chiba et al. ............... 378/35 |
| 6,359,969 | B1* | 3/2002 | Shmaenok ................. 378/156 |
| 6,459,472 | B1 | 10/2002 | De Jager et al. ............... 355/68 |
| 6,838,684 | B2* | 1/2005 | Bakker et al. ............ 250/492.2 |
| 6,867,843 | B2* | 3/2005 | Ogushi et al. ............... 355/30 |
| 7,057,190 | B2 | 6/2006 | Bakker et al. ............ 250/492.2 |
| 7,247,866 | B2* | 7/2007 | Bakker et al. ............ 250/492.1 |
| 2003/0020890 | A1* | 1/2003 | Ogushi et al. ............... 355/53 |
| 2003/0071979 | A1* | 4/2003 | Visser ........................ 355/30 |

(Continued)

FOREIGN PATENT DOCUMENTS

JP    01-265443 A    10/1989

(Continued)

OTHER PUBLICATIONS

English translation of Japanese Official Action issued on Dec. 17, 2008 in Japanese Application No. 2005-0375653.

*Primary Examiner*—David A Vanore
*Assistant Examiner*—Michael Maskell
(74) *Attorney, Agent, or Firm*—Pillsbury Winthrop Shaw Pittman, LLP (57) ABSTRACT

A method for filtering particles out of a beam of radiation propagating from a radiation source is provided. The method includes passing the beam of radiation through a filter having a first portion within the beam of radiation and a second portion outside of the beam of radiation, capturing at least some of the particles in the beam of radiation with the first portion, and moving the filter in a direction that is transverse to the beam of radiation so that the first portion is moved outside of the beam of radiation and the second portion is moved into the beam of radiation.

27 Claims, 7 Drawing Sheets

U.S. PATENT DOCUMENTS

| | | | |
|---|---|---|---|
| 2004/0099820 A1* | 5/2004 | Bristol | 250/493.1 |
| 2004/0108465 A1* | 6/2004 | Bakker et al. | 250/492.1 |
| 2004/0165171 A1* | 8/2004 | Tran et al. | 355/71 |
| 2004/0184014 A1* | 9/2004 | Bakker et al. | 355/30 |
| 2006/0012761 A1 | 1/2006 | Bakker et al. | 355/30 |
| 2006/0138362 A1 | 6/2006 | Bakker et al. | 250/504 |
| 2006/0151717 A1* | 7/2006 | Klunder et al. | 250/492.2 |

FOREIGN PATENT DOCUMENTS

| | | |
|---|---|---|
| JP | 04-112498 A | 4/1992 |
| JP | 08-194100 A | 7/1996 |
| JP | 2000-019297 A | 1/2000 |
| JP | 2002-313598 A | 10/2002 |
| JP | 2004-214656 A | 7/2004 |

* cited by examiner

METHOD FOR FILTERING PARTICLES OUT OF A BEAM OF RADIATION AND FILTER FOR A LITHOGRAPHIC APPARATUS

CROSS-REFERENCE TO RELATED APPLICATIONS

The present application is a continuation-in-part of U.S. patent application Ser. No. 11/317,240, filed Dec. 27, 2005 now U.S. Pat. No. 7,414,251, which claims the benefit of priority from U.S. Provisional Patent Application No. 60/639, 318, filed Dec. 28, 2004, the entire contents of which are both incorporated herein by reference.

FIELD

The present invention relates to a method for filtering particles out of a beam of radiation propagating from a radiation source and a filter for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to image smaller features, it has been proposed to use extreme ultraviolet radiation (EUV) with a wavelength in the range of 5 to 20 nm, particularly 13.5 nm, or a charged particle beam, e.g. an ion beam or an electron beam, as the exposure radiation in a lithographic apparatus. An example of an EUV radiation source is a laser produced plasma source or a discharge produced plasma source. Plasma radiation sources, however, besides EUV radiation often generate debris, which debris should be kept from entering an illumination system and/or a projection lens.

International Patent Application WO 99/42904, incorporated herein by reference, discloses a debris filter including a plurality of foils or plates, which foils or plates are arranged radially around the radiation source.

European Patent Application EP 1274287 discloses a debris removing system for preventing debris emitted by a radiation source, from entering an optical system. The debris removing system includes a trapping unit having a trapping surface, e.g. a plurality of fins, (approximately) parallel to an axis passing through the radiation source. The debris removing system further includes a rotation unit for rotating the trapping unit about the axis.

SUMMARY

According to an aspect of the invention, a method for filtering particles out of a beam of radiation propagating from a radiation source is provided. The method includes passing the beam of radiation through a filter having a first portion within the beam of radiation and a second portion outside of the beam of radiation, capturing at least some of the particles in the beam of radiation with the first portion, and moving the filter in a direction that is transverse to the beam of radiation so that the first portion is moved outside of the beam of radiation and the second portion is moved into the beam of radiation.

According to an aspect of the invention, there is provided a method for filtering particles out of a beam of radiation propagating from a radiation source. The method includes passing the beam of radiation through a filter that includes an endless member. The endless member includes an exposed portion that is exposed to the beam of radiation. The method also includes capturing at least some of the particles in the beam of radiation, and moving the endless member within the filter so that the exposed portion of the endless member moves out of the beam of radiation.

According to an aspect of the invention, a filter for filtering particles out of a beam of radiation in a lithographic apparatus is provided. The filter includes a plurality of filter elements. Each filter element is configured to have a first portion positioned within the beam of radiation and a second portion positioned outside of the beam of radiation when the beam of radiation passes through the filter. The filter also includes an actuator constructed and arranged to move the filter elements so that the first portion of each filter element is moved out of the beam of radiation.

According to an aspect of the invention, a filter for filtering particles out of a beam of radiation in a lithographic apparatus is provided. The filter includes at least one endless member defining a plurality of filter elements. A first portion of each filter element is configured to be within the beam of radiation and a second portion of each filter element being configured to be outside of the beam of radiation when the beam of radiation passes through the filter. The filter also includes at least one driving member configured to move the endless member such that the first portion of each filter member moves out of the beam of radiation and the second portion of each filter member moves into the beam of radiation.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2b depicts an example of a sectional view taken along line B-B in FIG. 2a;

DETAILED DESCRIPTION

Figure 1:
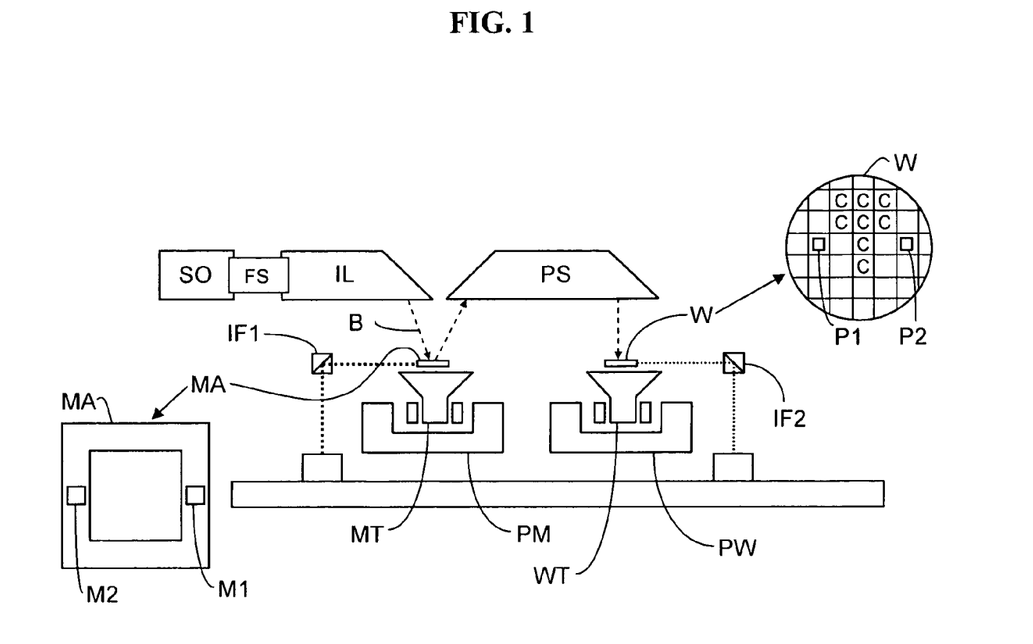
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The radiation source may also produce debris particles. A filter system, or filter, FS may be included to at least reduce the number of particles that, after leaving the radiation source SO, reach the illuminator IL. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure 2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
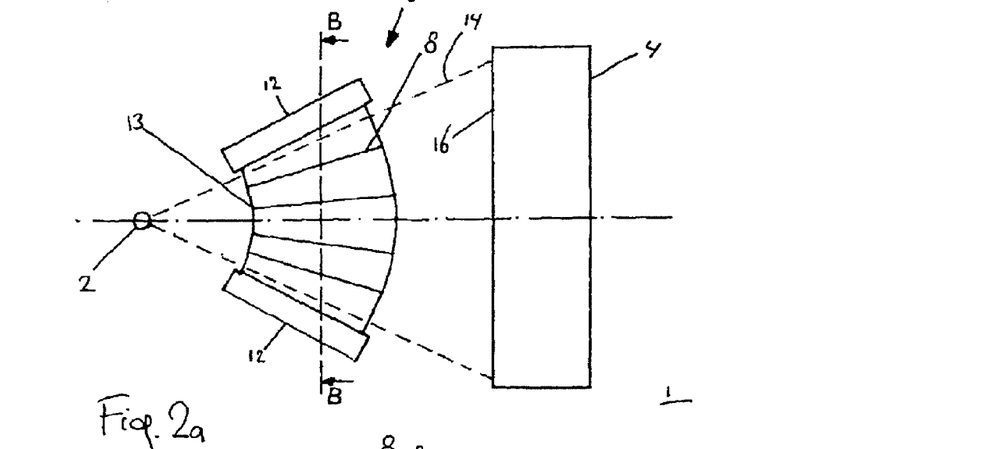
FIG. 2a depicts an example of a schematic top view of a first embodiment of an apparatus according to the invention.
Figure 2B:
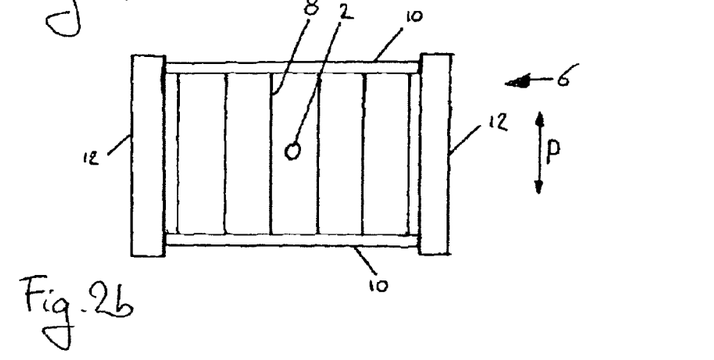

FIGS. 2a and 2b show an example of a first embodiment of an apparatus 1 according to the invention. FIG. 2a shows an example of a schematic top view of the apparatus 1 according to the invention. FIG. 2b shows an example of a sectional view taken along line B-B in FIG. 2a. In the example of FIGS. 2a and 2b, the apparatus 1 includes a radiation source 2, a processing system 4, e.g. the illuminator IL, for processing the radiation from the radiation source, and a filter system 6. The radiation source 2 may, for example, be a plasma radiation source, e.g. a Sn-source or a Xe-source. The filter system 6 includes at least one foil 8. In the example of FIGS. 2a and 2b, the filter system 6 includes a plurality of foils 8. In this example the foils 8 are slack foils. The foils 8 are connected to mounting plates 10, e.g. by gluing, welding, soldering, clamping or bolting. The mounting plates 10 are spaced apart by spacers 12. In this example two spacers 12 are shown. It will be appreciated that also one spacer may be used, or more than two spacers. The spacers 12 provide a space between the mounting plates 10 for the radiation to pass. In this example, a tensile force is exerted on the foils 8, i.e a force which substantially acts in a direction in which the respective foils extend. Thus, the foils 8, which may be bent, buckled or otherwise deformed prior to exerting the tensile force, due to the slackness of the foils 8, are stretched between the mounting plates. In this example, at least one foil, e.g. each foil 8, extends in a virtual flat plane. In this example, the respective virtual flat planes intersect the radiation source 2, i.e. the virtual planes extend parallel to the direction in which the radiation as emitted by the radiation source 2 propagates. Thus the radiation from the source 2 only impinges on the thin edges 13 of the respective foils 8. This may provide the advantage that the filter system 6 efficiently transmits radiation. Another potential advantage is obtained by the fact that the slack foils 8 can be manufactured from other materials than rigid foils, which are used in filter systems known in the art. This allows for using materials that are easier to handle and/or tool during manufacture and/or materials that are less expensive than the materials used for manufacturing the rigid foils used in filter systems known in the art. It is also possible to use materials which have e.g. better or other thermal or electrical properties, because mechanical stiffness of the foils is less important since the slack foils 8 are stretched, i.e. substantially extended in the virtual flat plane, and do not depend on inherent stiffness of the foils to extend in the virtual plane. Another potential advantage may be obtained by the fact that the slack foils can be manufactured from thinner materials than rigid foils which are used in filter systems known in the art. This allows to provide filter systems with better radiation transmission efficiency than filter systems with rigid foils, as less radiation impinges on the thinner edges 13 of the slack foils than on the thicker edges of the rigid foils used in filter systems known in the art.

In the example of FIGS. 2a and 2b, the tensile force exerted on the foils 8 can be generated by arranging the spacers 12 to move, e.g. by spring action, the mounting plates 10 away from each other in the direction of arrow P in FIG. 2b. It is also possible to exert the tensile force e.g. by using mounting plates 10 which tend to move, e.g. bend, away from each other, like e.g. leaf springs. It is also possible to connect the flexible foils 8 to mounting units on the mounting plate 10 that exert the tensile force, e.g. by using springs, piezo-electric crystals, memory metal or magnets.

In the example of FIGS. 2a and 2b, the radiation source 2 emits radiation, e.g. EUV radiation having a wavelength in the range of 5 to 20 nm. A beam 14 of the radiation propagates through a predetermined cross section 16, e.g. through an entrance opening of the processing system 4. The beam 14 has an opening angle, which angle can e.g. be approximately ninety degrees. In this example the radiation source 2 also emits debris. The debris is e.g. emitted from the radiation source 2 in a flight direction, which may be substantially the same direction as the direction in which the radiation propagates, in this example radially away from the radiation source. The radiation and debris pass between the foils 8. The debris may slow down and/or change direction, e.g. by collision with gas molecules, atoms or other debris particles. This may cause the debris particles to collide with the, in this example radially arranged, foils 8 and possibly stick to the foils after collision. Thus, the number of debris particles leaving the filter system 6 is less than the number of debris particles entering the filter system 6, and the filter system effectively filters out debris particles from a stream of debris particles propagating from the source 2 to the processing system 4.

In the example of FIGS. 2a and 2b, the filter system 6 includes the plurality of foils 8. It is also possible to provide the filter system with at least one foil. It is, thus, possible to provide the operable filter system 6 for filtering particles out of the beam 14 of radiation (the filter system being suited for use in lithography, for example extreme ultraviolet lithography) by providing the slack foil for intercepting the particles, mounting at least a first point or side of the foil to a first position of a mounting device (e.g. the mounting plate 10) and substantially stretching the slack foil, at least within the beam of radiation, substantially parallel to a direction in which the radiation propagates.

Figure 3:
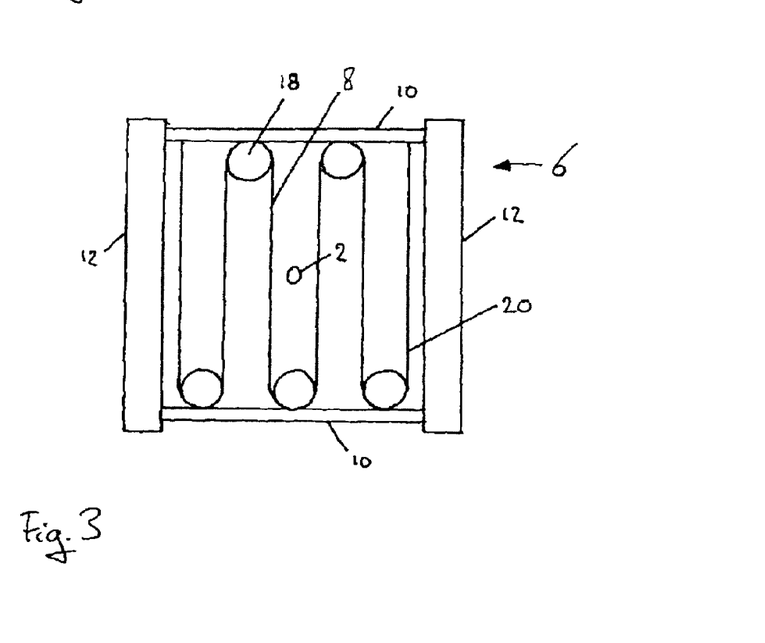
FIG. 3 depicts an example of a second embodiment of a filter system of the apparatus according to the invention.

FIG. 3 shows an example of a second embodiment of the filter system 6 of the apparatus 1 according to the invention. In the example of FIG. 3, the plurality of foils 8 is formed by a slack tape 20. Each individual foil 8 is, therefore, a segment of the slack tape 20. The tape 20 is arranged between the mounting plates 10, in this example, in a folded fashion, the tape being folded over turners 18. The turners 18 can e.g. be rods or pins. It is also possible that the tape 20 is connected to the mounting plates, e.g. by gluing, welding, soldering, clamping or bolting, instead of being folded over the turners. In the example of FIG. 3, a tensile force is applied to the tape 20. Thus, the foils 8, which are formed by the tape 20, are stretched between the mounting plates 10 and, in this example, each foil 8 extends in a virtual plane that intersects the radiation source 2, similarly as shown in FIG. 2a. Using the tape 20 provides the advantage, that construction and/or assembly of the filter system 6 can further be simplified. Contrary to the embodiment of the filter system 6 of FIGS. 2a and 2b, the foils 8 of the embodiment of the filter system 6 of FIG. 3 are not entirely parallel to the radiation emitted by the radiation source 2. This may cause some radiation to be absorbed by the foils, and consequently the transmission efficiency of the filter system to be (slightly) reduced.

Figure 4:
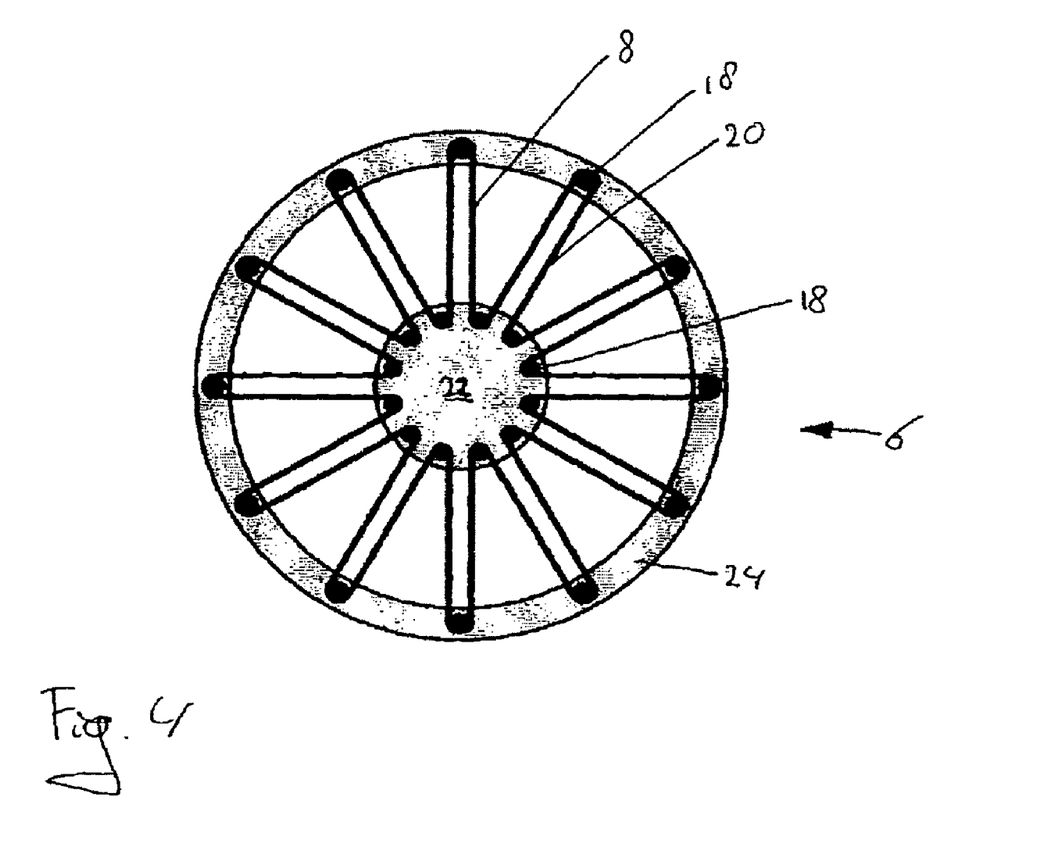
FIG. 4 depicts an example of a third embodiment of the filter system of the apparatus according to the invention.

FIG. 4 shows an example of a third embodiment of the filter system 6 of the apparatus according to the invention. In the example of FIG. 4, the filter system 6 includes an inner ring 22 and an outer ring 24. The inner and outer rings 22, 24 are both provided with turners 18, e.g. pins. In the example of FIG. 4, the plurality of foils 8 is formed by a slack tape 20. Each individual foil 8 is, therefore, a segment of the slack tape 20. The slack tape 20 is arranged between the inner and outer ring 22, 24. In this example, the tape 20 is folded between the turners 18. In the example of FIG. 4, the filter system 6 is arranged to exert a tensile force on the tape 20. The tensile force can e.g. be exerted by the inner ring 22, the outer ring 24 or the turners 18. The tensile force can be applied such that the tape is stretched, e.g. by a spring construction, even when thermal expansion of the tape 20 is present. In the example of FIG. 4, the foils 8 of the tape 20 are substantially arranged radially with respect to the inner and outer ring 22, 24. It is also possible to provide separate foils 8 between the inner and outer ring 22, 24. Each foil can then be mounted to the inner ring 22 and to the outer ring 24. It is possible to exert the tensile force e.g. by using the inner and outer ring 22, 24 which tend to move away from each other, e.g. by spring action or elasticity. It is also possible to connect the flexible foils 8 to mounting units on the inner and/or outer ring 22, 24 that exert the tensile force, e.g. by using springs, piezo-electric crystals, memory metal or magnets.

The filter system 6 shown in FIG. 4 may be used in a stationary situation, i.e. the filter system 6 may, at least partly, be positioned motionless in the beam 14 of radiation. In use, the filter system shown in FIG. 4 may also be rotated, e.g. around an axis through the center of the inner ring 22. Thus, the foils 8 may be rotated around the axis. The rotating foils 8 more effectively intercept the debris particles, than stationary foils. European patent application EP1274287 describes the use of rotating foils for intercepting debris particles from a radiation source in more detail. It will be appreciated that the inner ring 22 can also be part of an axle of the filter system 6. It is advantageous if, in use, the axis is directed towards the radiation source 2, so that the foils substantially extend parallel to a direction in which the radiation propagates.

Figure 5:
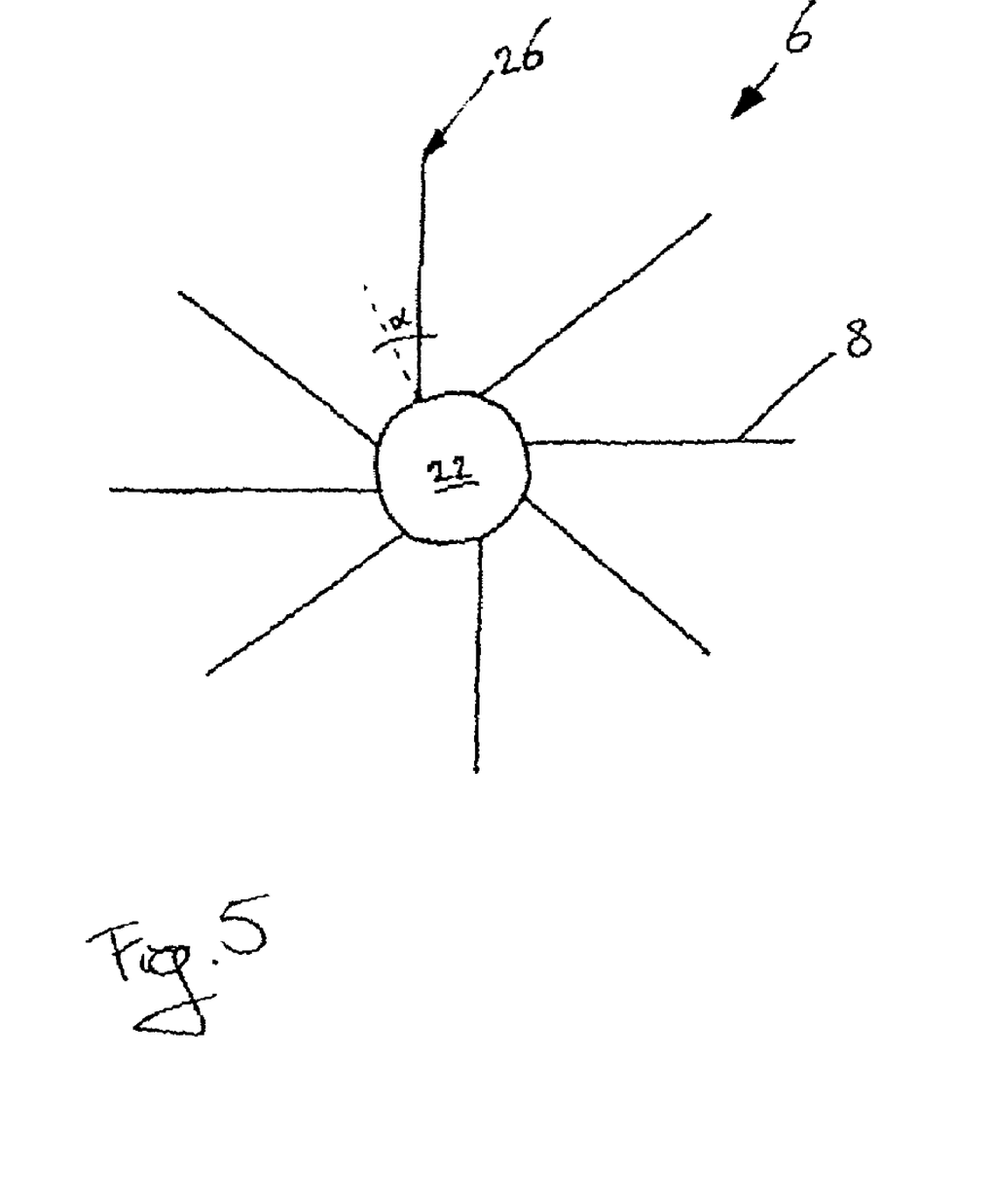
FIG. 5 depicts an example of a fourth embodiment of the filter system of the apparatus according to the invention.

FIG. 5 shows an example of a fourth embodiment of the filter system 6 of the apparatus according to the invention. The filter system 6 includes at least one foil. In the example of FIG. 5, a plurality of slack foils 8 is connected to the inner ring or axle 22. In a stationary situation, it is possible that the foils 8 bend, buckle, fold or otherwise refrain from substantially extending substantially parallel to a direction in which the radiation propagates. In use, the inner ring 22 may rotate around its axis. When the inner ring 22 rotates, the slack foils 8 are also rotated around the axis. Due to the rotation of the slack foils 8, a centrifugal force, directed radially away from the inner ring 22, will be exerted on the slack foils. The centrifugal force acts as the tensile force, and stretches the slack foils 8 away from the inner ring 22. While rotating, the slack foils 8 may also experience a friction force due to friction of the foils with a surrounding atmosphere, e.g. a gas, which friction force causes the foils to make an angle $\alpha$ with a normal of the inner ring 22. The geometry, dimensions and weight of the foils 8, the pressure and mass of the surrounding atmosphere, and the rotation speed of the inner ring 22 can be chosen such that the friction force is (much) smaller than the centrifugal force, and that the slack foils are, in use, directed substantially radially away from the inner ring 22. It is also possible to arrange a mass on each of the slack foils to increase the centrifugal force. The mass can e.g. be arranged on an edge 26 furthest away from the inner ring 22. If the centrifugal force on the foil 8 is increased, the angle $\alpha$ will be decreased. Thus, in the example of FIG. 5, the filter system 6 provides, in use, stretched foils, which may be directed radially away from the axis. The stretched foils may each substantially extend in a virtual flat plane. It is advantageous if, in use, the axis is directed towards the radiation source 2, so that the foils substantially extend parallel to a direction in which the radiation propagates. It is, thus, possible to provide the operable filter system 6 for filtering particles out of the beam 14 of radiation, the filter system 6 being suited for use in lithography, for example extreme ultraviolet lithography, by providing the slack foil for intercepting the particles, mounting at least a first point or side of the foil or wire to a first position of a mounting assembly (e.g. the inner ring 22) and substantially stretching the slack foil, at least in use, at least within the beam 14 of radiation, substantially parallel to a direction in which the radiation propagates. In manufacture, however, the slack foils need not be stretched, nor directed radially away from the axis. This allows for using materials that are easier to handle and/or tool during manufacture and/or materials that are less expensive than the materials required for manufacturing the rigid foils used in filter systems known in the art. It is also possible to use materials which have e.g. better or differing thermal or electrical properties, because mechanical stiffness of the foils 8 is less important since the slack foils 8 are stretched, i.e. substantially extended in the virtual flat plane, and do not depend on inherent stiffness of the foils to extend in the virtual plane. Another potential advantage may be obtained by the fact that the slack foils can be manufactured from thinner materials than rigid foils which are used in filter systems known in the art. This may allow to provide filter systems with better radiation transmission efficiency than filter systems with rigid foils, as less radiation impinges on the thinner edges 13 of the slack foils than on the thicker edges of the rigid foils which are used in filter systems known in the art.

In the examples of FIGS. 2-5 slack foils are used. It will be appreciated that it is also possible to use slack wires for intercepting debris particles. It is also possible to replace each foil by a plurality of wires, which wires, at least in use, e.g. extend in a plane that intersects the source. It is also possible to use a thread which forms the plurality of wires.

Figure 6A:
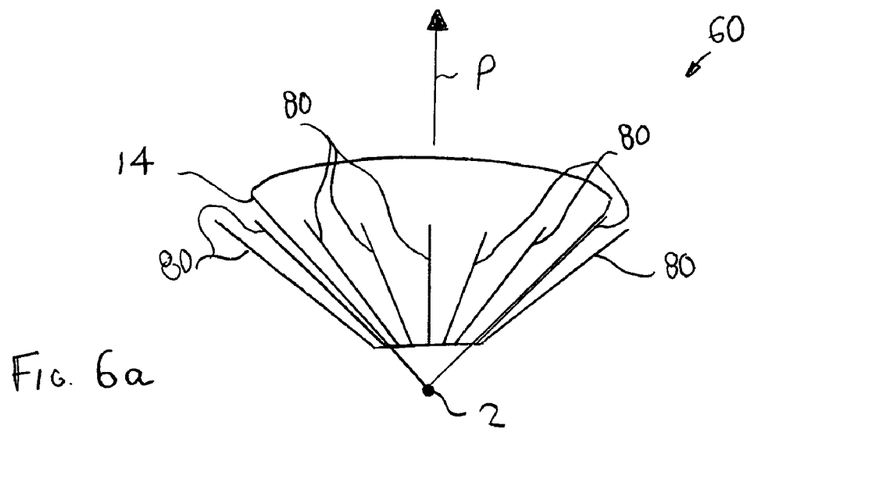
FIG. 6a is a schematic top view of another embodiment of the filter system of the apparatus according to the invention.
Figure 6B:
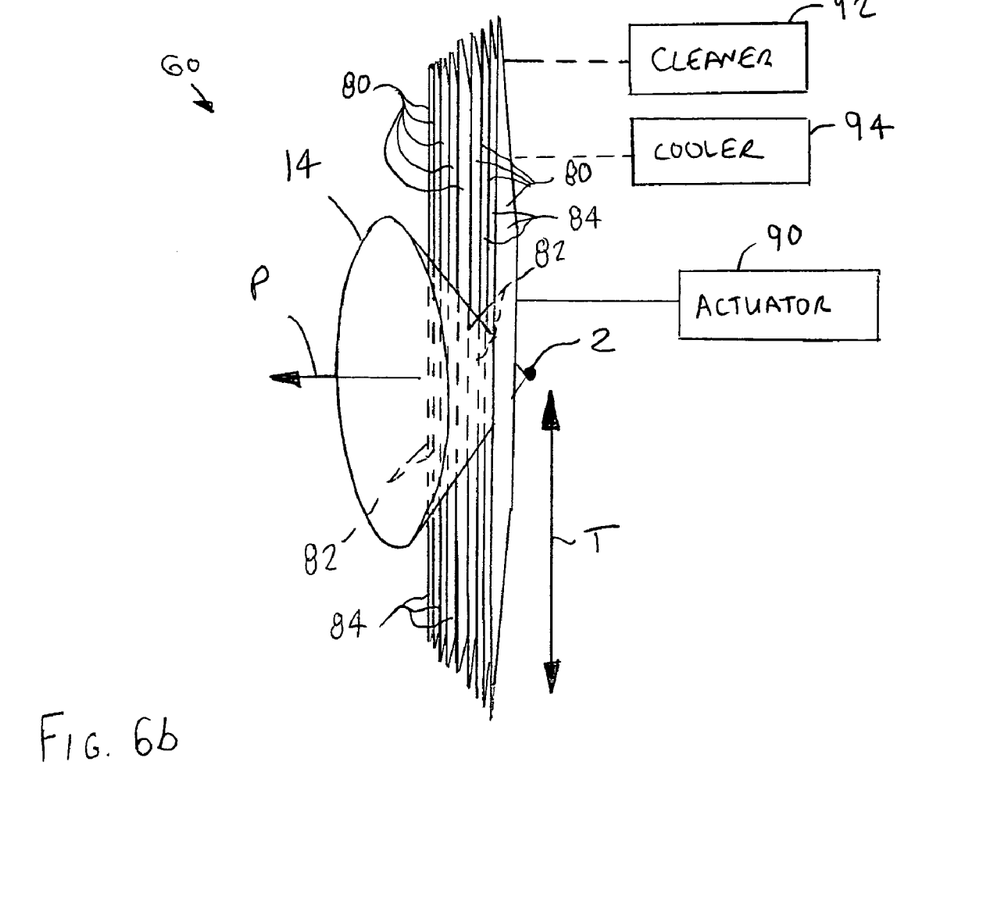
FIG. 6*b* is a schematic side view of the filter system of FIG. 6*a*.

FIGS. 6a and 6b illustrate another embodiment of a filter 60 of the apparatus. The filter 60 includes at least one filter element 80 that is disposed substantially parallel to the propagation direction of the beam of radiation 14 away from the radiation source 2. As shown, the filter 60 includes a plurality of filter elements 80. Although the beam of radiation 14 propagates in a cone-like shape, and therefore the filter elements 80 are disposed in a fan-out orientation so that the radiation may pass through the filter 60 with minimum obstruction, as shown in FIG. 6a, an average direction of propagation may be represented by arrow P shown in FIGS. 6a and 6b. The filter elements 80 may be foils, or may be any other filter element that is configured to capture particles from the beam of radiation 14. For example, the filter elements 80 may be created from plates of any suitable material, or may be created with a wire or slack tape to create a slack foil as described above. The illustrated embodiment is not intended to be limiting in any way.

As shown in FIG. 6b, each filter element 80 includes a first or exposed portion 82 that is located in the beam of radiation 14 and a second or unexposed portion 84 that is located outside of the beam of radiation. The filter 60 may also include an actuator 90 that is operatively connected to the filter elements 80 in such a manner that the plurality of filter elements 80 may be translated relative to the beam of radiation 14 in a direction represented by arrow T. As shown, the translation direction T is transverse to the average propagation direction P of the beam of radiation 14. In an embodiment, the transverse direction T is generally perpendicular to the average propagation direction P. By providing a filter 60 that is movable relative to the beam of radiation 14 in such a manner, the first portions 82 of the filter elements 80 may be moved out of the beam of radiation 14 and the second portions 84 of the filter elements 80 may be moved into the beam of radiation 14 at selected times. This may allow for the first portions 82 of the filter elements 80 that have been moved out of the beam of radiation 14 to be cleaned and/or cooled with a cleaner 92 and/or cooler 94 that are located away from the beam of radiation 14, as schematically illustrated in FIG. 6b. Once the first portions 82 of the filter elements 80 have been cleaned and/or cooled, the filter elements 80 may be moved again to re-locate the first portions 82 back into the beam of radiation 14, and allow the second portions 84 that have been moved out of the beam of radiation 14 to be cleaned and/or cooled.

Figure 7:
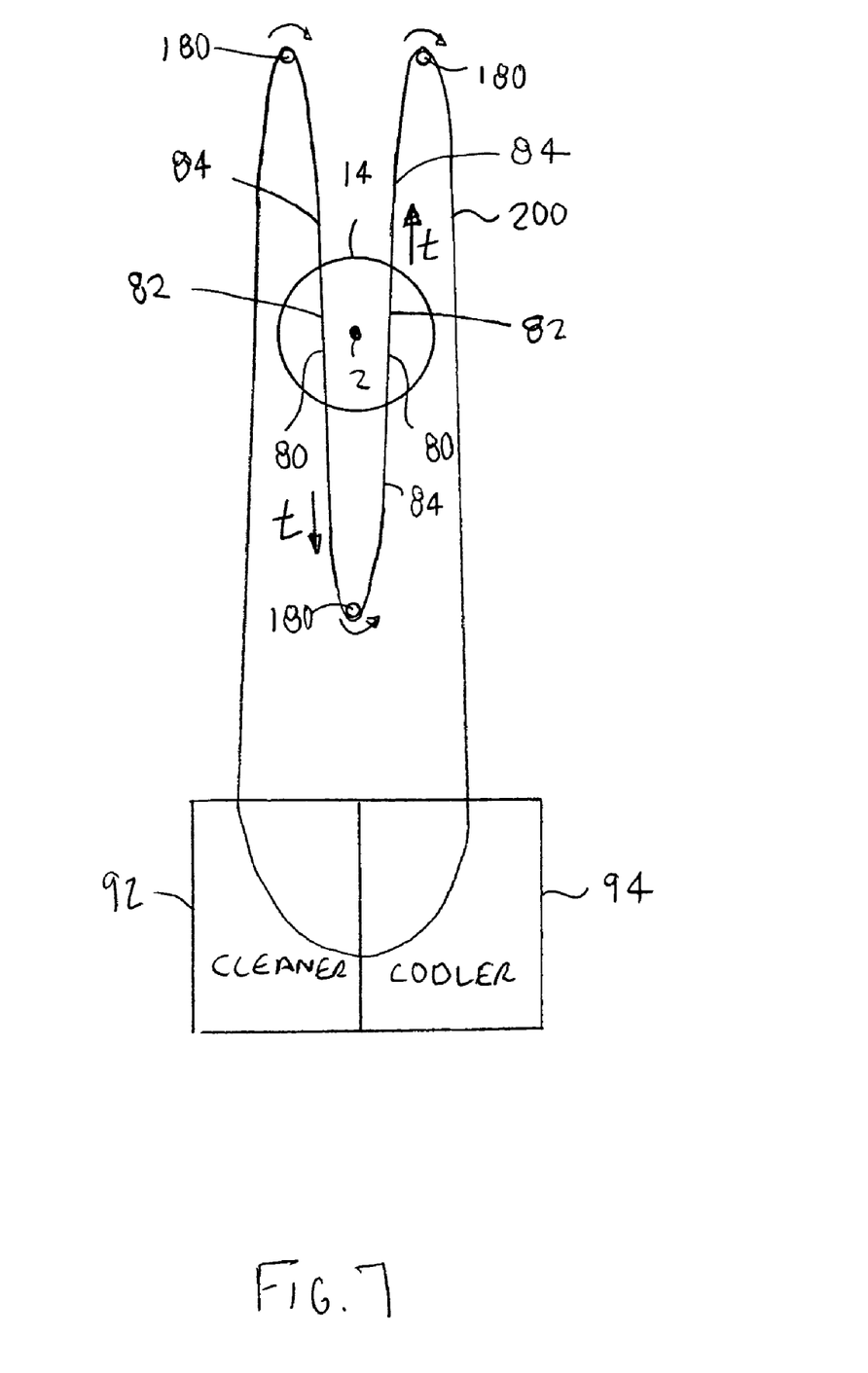
FIG. 7 is a partial schematic front view of another embodiment of the filter system of FIGS. 6*a* and 6*b*.

In an embodiment illustrated in FIG. 7, an endless member 200 may used to define the plurality of filter elements 80. The endless member 200 may, in one embodiment, be a belt or a slack tape similar to the slack tape 20 described above. Only a single endless member 200 that defines a pair of filter elements 80 is shown. Of course, a plurality of endless members may be included in the filter, or the single endless member may be configured to define may filter elements. The illustrated embodiment is not intended to be limiting in any way.

In the illustrated embodiment, the first portions 82 of the filter elements 80 pass through the beam of radiation 14 in a direction that is transverse to the average direction of propagation of the beam of radiation 14, as represented by arrows t. Driving members 180 are positioned on opposite sides of the beam of radiation 14 so as to provide tension in the endless member 200, as well as movement of the endless member 200. Each driving member 180 may be a roller, wheel, turner or any other member that is configured to move the endless member so that the endless member moves along its defined path. It is also contemplated that a single driving member may be used with a single endless member. The illustrated embodiment is not intended to be limiting in any way.

As shown in FIG. 7, the cleaner 92 and/or cooler 94 may be positioned away from the beam of radiation 14 and the endless member 200 may pass therethough so that the filter elements 80 may be cooled and any debris that collects on the first portions 82 of the filter elements 80 may be removed from the filter elements 80. Of course, additional driving members 180 may be used to help define additional filter elements 80 with the same endless member 200 and/or additional endless members 200 may be used to define additional filter elements 80. The illustrated embodiment is not intended to be limiting in any way.

Figure 8:
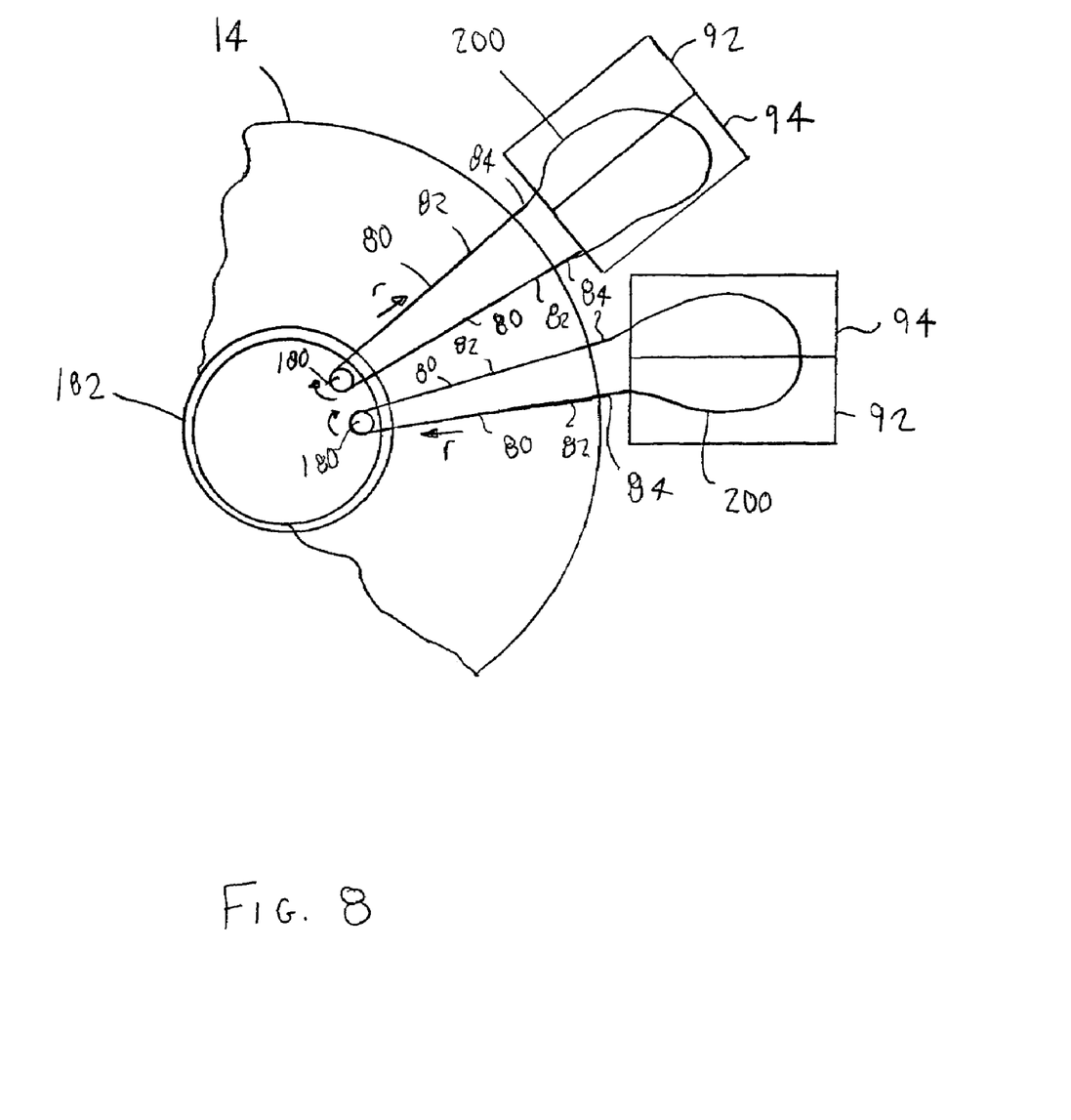
FIG. 8 is a partial schematic front view of another embodiment of the filter system of the apparatus according to the invention.

As shown in FIG. 8, in an embodiment, more than one endless member 200 may be used to define a plurality of filter elements 80 that are disposed so that they move in a radial direction relative to the average direction of propagation of the beam of radiation 14 from the radiation source 2. As illustrated, a plurality of driving members 180 may be disposed behind a heat shield 182 so that the driving members are protected from the beam of radiation 14. Exposed portions 82 of the filter elements 80 extend radially outwardly from the heat shield 182 and unexposed portions 84 extend radially outwardly from the beam of radiation 14, as shown in FIG. 8. The endless members 200 may then be routed through the associated cleaner 92 and/or cooler 94 so that particles that have been captured by the filter elements 80 may be cleaned and/or the filter elements 80 may be cooled as the endless members 200 travel in directions represented by arrows r. As shown schematically in FIG. 8, the arrangement of the cleaner 92 and the cooler 94 may vary, i.e., the cleaner 92 may be located before the cooler 94 or the cooler 94 may be located before the cleaner 92 as each endless member 200 is advanced therethrough. It is also contemplated that a single cleaner and/or a single cooler may be provided for the entire filter 60. The illustrated embodiment is not intended to be limiting in any way.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm), extreme ultra-violet (EUV) radiation (e.g. having a wavelength in the range of 5-20 nm) and (soft) X-Ray radiation, as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for filtering particles out of a beam of radiation propagating from a radiation source, the method comprising:
   passing the beam of radiation through a filter comprising a filter element having a first portion within the beam of radiation and a second portion outside of the beam of radiation;
   capturing at least some of the particles in the beam of radiation with the first portion; and
   translating the filter element relative to the beam of radiation in a direction that is transverse to the beam of radiation so that the first portion is moved outside of the beam of radiation and the second portion is moved into the beam of radiation.

2. A method according to claim 1, further comprising cooling the first portion of the filter after the first portion has moved outside of the beam of radiation.

3. A method according to claim 1, further comprising cleaning the captured particles from the first portion of the filter after the first portion has been moved outside of the beam of radiation.

4. A method according to claim 1, wherein the filter element is oriented substantially parallel to the beam of radiation.

5. A method according to claim 4, wherein the filter comprises a plurality of filter elements oriented substantially parallel to the beam of radiation, and wherein said particles are captured with the plurality of filter elements.

6. A method according to claim 5, wherein the plurality of filter elements are a plurality of foils.

7. A method according to claim 6, wherein the plurality of foils are a plurality of slack foils.

8. A method according to claim 1, wherein said moving comprises moving the filter in a direction that is perpendicular to the beam of radiation.

9. A method for filtering particles out of a beam of radiation propagating from a radiation source, the method comprising:
   passing the beam of radiation through a filter comprising an endless member, the endless member comprising an exposed portion that is exposed to the beam of radiation;
   capturing at least some of the particles in the beam of radiation; and
   moving the endless member within the filter so that the exposed portion of the endless member moves out of the beam of radiation.

10. A method according to claim 9, further comprising cooling the exposed portion of the endless member after the exposed portion has been moved out of the beam of radiation.

11. A method according to claim 9, further comprising cleaning the captured particles from the exposed portion of the endless member after the exposed portion has been moved out of the beam of radiation.

12. A method according to claim 9, wherein the exposed portion of the endless member is oriented substantially parallel to the beam of radiation.

13. A method according to claim 12, wherein said moving comprises using at least one driving member configured to move the endless member such that the endless member moves through the beam of radiation in a direction transverse to the beam of radiation.

14. A method according to claim 13, wherein said moving comprises rotating a first roller and a second roller, the first roller and the second roller being disposed on opposite sides of the beam of radiation so that the endless member moves through the beam of radiation in the direction transverse to the beam of radiation.

15. A method according to claim 13, wherein said moving comprises rotating at least one roller configured to move the endless member radially relative to the beam of radiation.

16. A method according to claim 9, wherein the endless member is a belt.

17. A method according to claim 9, wherein the endless member is a slack tape.

18. A filter for filtering particles out of a beam of radiation in a lithographic apparatus, the filter comprising:
   a plurality of filter elements, each filter element being configured to have a first portion positioned within the beam of radiation and a second portion positioned outside of the beam of radiation when the beam of radiation passes through the filter; and
   an actuator constructed and arranged to translate the filter elements in a direction transverse to the beam of radiation so that the first portion of each filter element is moved out of the beam of radiation.

19. A filter according to claim 18, further comprising a cooler for cooling the first portions of the filter elements that have been moved outside of the beam of radiation.

20. A filter according to claim 18, further comprising a cleaner for cleaning particles from the first portions of the filter elements that have been moved outside of the beam of radiation.

21. A filter according to claim 18, wherein the first portions of the filter elements are oriented substantially parallel to the beam of radiation.

22. A filter for filtering particles out of a beam of radiation in a lithographic apparatus, the filter comprising:
   at least one endless member defining a plurality of filter elements, a first portion of each filter element being configured to be within the beam of radiation and a second portion of each filter element being configured to be outside of the beam of radiation when the beam of radiation passes through the filter; and
   at least one driving member configured to move the endless member such that the first portion of each filter member moves out of the beam of radiation and the second portion of each filter member moves into the beam of radiation.

23. A filter according to claim 22, further comprising a mounting assembly comprising at least two spatially separated portions on opposite sides of the beam of radiation for mounting the endless member between the at least two spatially separated portions.

24. A filter according to claim 23, wherein the endless member is stretched between the at least two spatially separated portions.

25. A filter according to claim 22, wherein the endless member, at least within the beam of radiation, is stretched so as to substantially extend in a plurality of virtual flat planes.

26. A filter according to claim 22, wherein the endless member is a belt.

27. A filter according to claim 22, wherein the endless member is a slack tape.

* * * * *